United States Patent
Wei

(10) Patent No.: US 6,587,341 B1
(45) Date of Patent: Jul. 1, 2003

(54) HEAT DISSIPATER STRUCTURE

(75) Inventor: Wen-Chen Wei, Taipei Hsien (TW)

(73) Assignee: Chun Long Metal Co., Ltd., Taipei Hsien (TW)

(*) Notice: Subject to any disclaimer, the term of this patent is extended or adjusted under 35 U.S.C. 154(b) by 0 days.

(21) Appl. No.: 10/086,546

(22) Filed: Mar. 4, 2002

(51) Int. Cl.⁷ ................................................ H05K 7/20
(52) U.S. Cl. .................. 361/695; 361/697; 361/691; 361/694; 361/696; 415/176; 165/122; 165/80.3; 257/718; 257/727; 174/16.3
(58) Field of Search .................. 361/704, 707, 361/709, 710, 695; 257/718, 719, 722; 174/16.3; 165/80.3, 185

(56) References Cited

U.S. PATENT DOCUMENTS

| 5,409,352 A | * | 4/1995 | Lin | 415/177 |
| 5,421,402 A | * | 6/1995 | Lin | 165/80.3 |
| 5,523,918 A | * | 6/1996 | Chiou | 361/695 |
| 5,566,749 A | * | 10/1996 | Jordan et al. | 165/80.3 |
| 5,584,339 A | * | 12/1996 | Hong | 165/80.3 |
| 5,661,638 A | * | 8/1997 | Mira | 361/697 |
| 5,867,365 A | * | 2/1999 | Chiou | 361/690 |
| 5,943,209 A | * | 8/1999 | Liu | 361/695 |
| 6,053,242 A | * | 4/2000 | Hsieh | 165/121 |
| 6,179,561 B1 | * | 1/2001 | Horng | 415/208.3 |
| 6,406,258 B1 | * | 6/2002 | Lin et al. | 415/213.1 |

* cited by examiner

Primary Examiner—Boris Chervinsky
(74) Attorney, Agent, or Firm—Troxell Law Office PLLC

(57) ABSTRACT

A heat dissipater structure has a heat sink base with peripheral sides thereof folded upwards from the bottom plate and cut into a plurality of lateral plates at proper angles to form wind channels for current conduction and to define a receiving slot at the center for holding a fan. A convex block is disposed on two opposite lateral plates for easily hooking and assembling a cover body so as to allow the air current inducted by the fan to rapidly dissipate the heat absorbed by the bottom plate outwardly through the wind channels formed by the interference of the lateral plates.

1 Claim, 4 Drawing Sheets

HEAT DISSIPATER STRUCTURE

BACKGROUND OF THE INVENTION

1. Field of the Invention

The present invention relates to a heat dissipater structure more specially to a heat sink base with current conducting wind channels formed by folding an cutting the lateral plates thereof at proper angles to allow the heat to be dissipated rapidly along the wind channels for efficiently lowering the temperature.

2. Description of the Prior Art

Accordingly, a conventional heat sink device with a fan, as shown in FIG. 1, mainly comprises a fan (5) mounted in an inwardly concaved receiving slot formed at the center of the heat sinks (4), wherein the four lateral sides of a plurality of heat sinks (4) have grooved intervals to form hot air outlets (6). After being installed on the surface of an electronic heat generating element, the fan (5) starts to turn and induces the outside cool air to blow across the heat sinks (4) through a ventage (7) thereby dissipating the heat from the electric element outwardly through a hot air outlet (6) to achieve the heat dissipation function. However, since the internal end plane of the hot air outlet (6) is vertical and forms a wind wall that interferences with the current from the fan (5), a standstill layer tends to form and accumulate heat between the heat sinks (4) and the fan (5), which consumes the fan (5) power and not only fails to efficiently increase the heat dissipation function, but also becomes the major factor of causing the breakdown of the heat sink device. Furthermore, the assembly of the conventional heat sink device is not only inconvenience due to the requirement to use a screw for fastening, it also subjects the fan (5) to loosening or damage, and results in increased time and cost. Actually, it has troubled the industry for a long time and needs improvement.

In view of the various shortcomings of the conventional heat sink devices, the inventor of the present invention has continuously researched solutions for improvement and finally culminated in the innovation of a heat dissipater structure.

SUMMARY OF THE INVENTION

Specifically, the present invention comprises a heat sink base, a fan and a cover body, wherein the peripheral sides of the heat sink base are folded upwards from the bottom plate and cut into a plurality of lateral plates at proper angles. The lateral plates are cut according to the rotational direction of the fan and arranged at different angles to form proper wind channels. A receiving slot is disposed at the center of the heat sink base for holding the fan. The cover body is disposed to fitly cover and join with the fan as well as to fixedly retain the heat sink base. The top plane of the cover body is disposed with an air inlet and two diagonal areas of the bottom plane thereof are respectively formed into a downward retaining post and a stop plate. The bottom end of the retaining post extends to dispose a retaining hook to be retained and assembled with a convex block on the lateral plate of the heat sink base. The stop plate pushes against another lateral plate to prevent the heat sink base from loosening. Through this assembly, when the fan induces the air current, the whirling wind wall caused by the current is destroyed by the interference of the lateral plate thereby avoiding the phenomenon of the reverse current that resulted from the reflection and collision of the air current. Furthermore, an air outlet formed by the included angle between the lateral plates reduces the area of the flowing field and increases the wind pressure of the air current blowing toward the air outlet. Therefore the flowing speed of the air current is relatively increased and a current conducting wind channel is formed in front of the air outlet at the same time to enable the air current induced by the fan to be quickly and continuously circulated by the conduction of the wind channel without causing the situation of standstill. Furthermore, the hot source absorbed by the bottom plate is dissipated rapidly and outwardly towards the air outlets so as to achieve the maximum power of the fan and the best function of heat dissipation to specifically solve the overheating problem of the computer element.

Therefore, the primary objective of the present invention is to solve the problem of the limited heat dissipation efficiency of the conventional computer heat dissipater structure by cutting and folding upwards the bottom plate to form a plurality of lateral plates and wind channels at proper angles according to the wind directions to avoid the air current from staying but rapidly circulating to dissipate the hot source absorbed by the bottom plate so as to achieve the best effect of heat dissipation.

Another objective of the present invention is to provide a heat dissipater structure through a simple and fast assembly requiring no tools but using the convex block disposed on the lateral plate of the heat sink base as well as the corresponding hook retaining between the retaining post and the stop plate disposed on the cover body.

To enable a further understanding of the said objectives, the technological methods and specific structural features of the present invention, the brief description of the drawings below is followed by the detail description for additional elaboration.

DETAILED DESCRIPTION OF THE PREFERRED EMBODIMENTS

Figure 1:
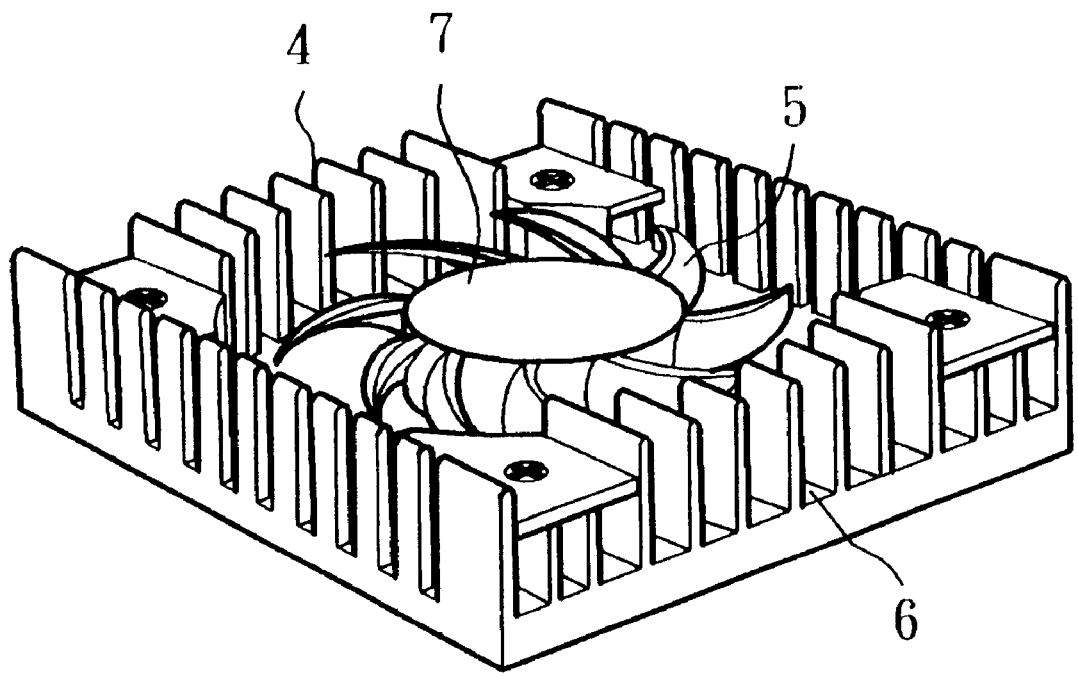
FIG. 1 is a pictorial drawing of a conventional heat sink device.
Figure 2:
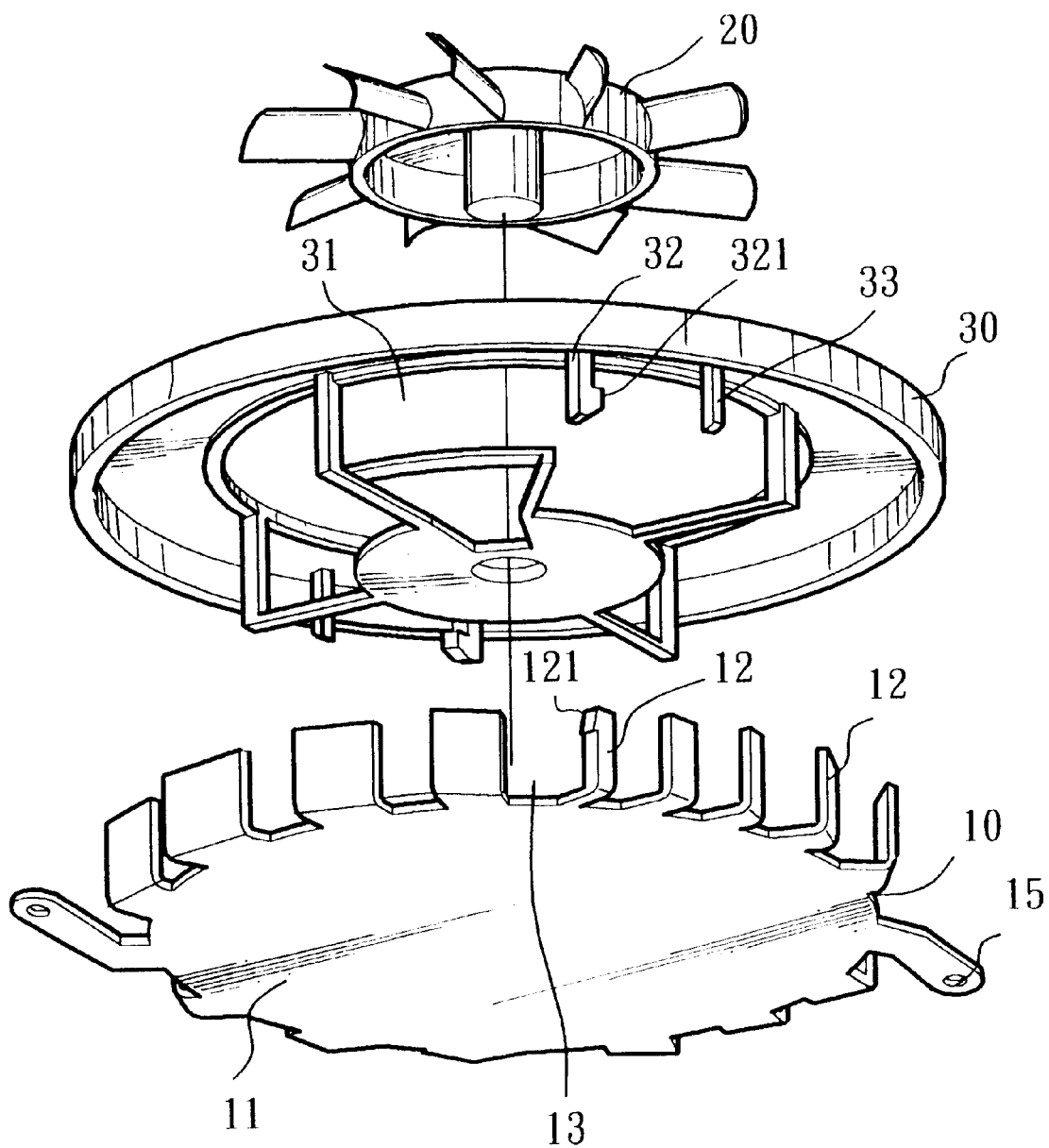
FIG. 2 is a pictorial and exploded drawing of the present invention.

FIG. 2 is an exploded drawing of the present invention, which includes a heat sink base (10), a fan (20) and a cover body (30). A positioning hole (15) disposed on the heat sink (10) can be fastened by a screw onto an electric heat generating element of a computer, wherein, the peripheral sides of the heat sink base (10) are folded and cut upwards from the bottom plate (11) to form a plurality of lateral plates (12) at proper angles. Each lateral plate (12) is cut according to the rotational direction of the fan (20) and arranged to define an air outlet (13) at a certain included angle to form a proper wind channel in front of the air outlet (13), which destroys the whirling wind wall caused when the operating fan (20) induces the air current, and to smoothly circulate the air current through the conduction of the wind channel. A receiving slot (now shown) is disposed at the center of the heat sink base (10) for holding the fan (20). The top ends of the lateral plates (12) located on two opposite ends extend to form convex blocks (121) to be retained and assembled with a retaining hook (321) disposed at the lower end of a retaining post (32) on the cover body (30). No tools are required, therefore assembly of the present invention is easy. The fan (20) is assembled with the cover body (30) and pivotally mounted on the receiving slot of the heat sink base (10). An air inlet (31) is disposed on the top plane of the cover body (30). A retaining post (32) and a stop block (33) are formed downwardly and respectively at two diagonal angle areas on the bottom plane thereof. Furthermore, the bottom end of the retaining post (32) extends to dispose the outward retaining hook (321) to retain and assemble with the convex block (121) on the lateral plate (12) of the heat sink base (10). The stop block (33) pushes against the outer side of another lateral plate (12). Since the planes on the stop block (33) and the lateral plate (12) face at different directions, once the retaining post (32) and the convex block (121) are hooked and retained, the stop block (33) thereby pushes against the lateral plate (12) in reverse direction to prevent the heat sink base (10) from loosening.

Figure 3:
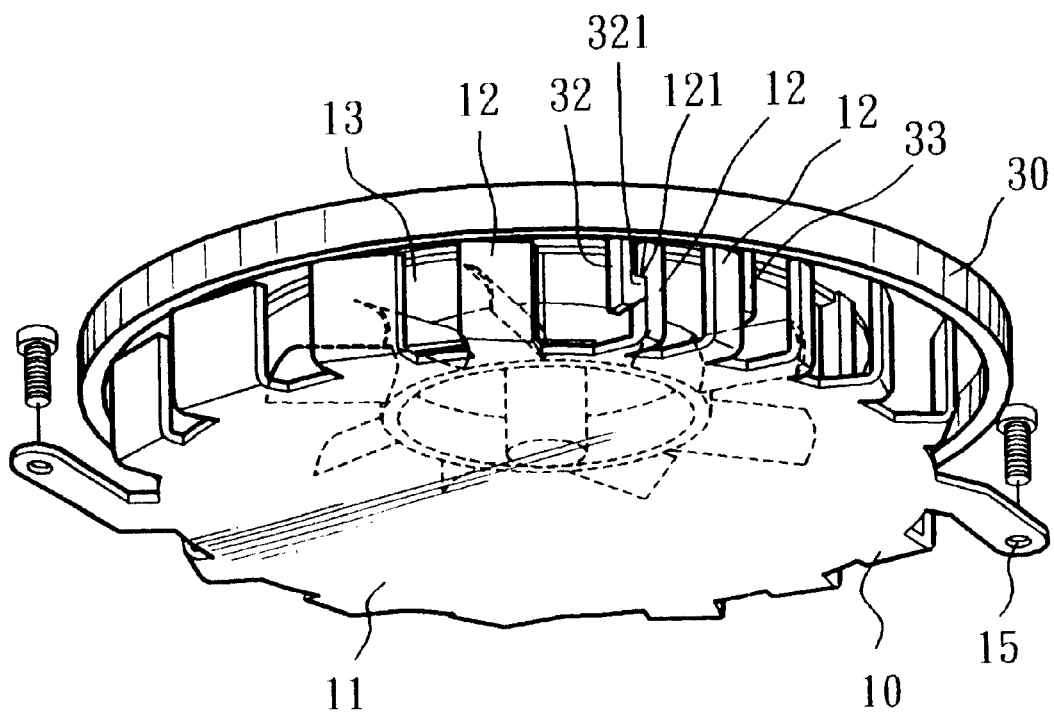
FIG. 3 is a schematic drawing of the assembled present invention.
Figure 4:
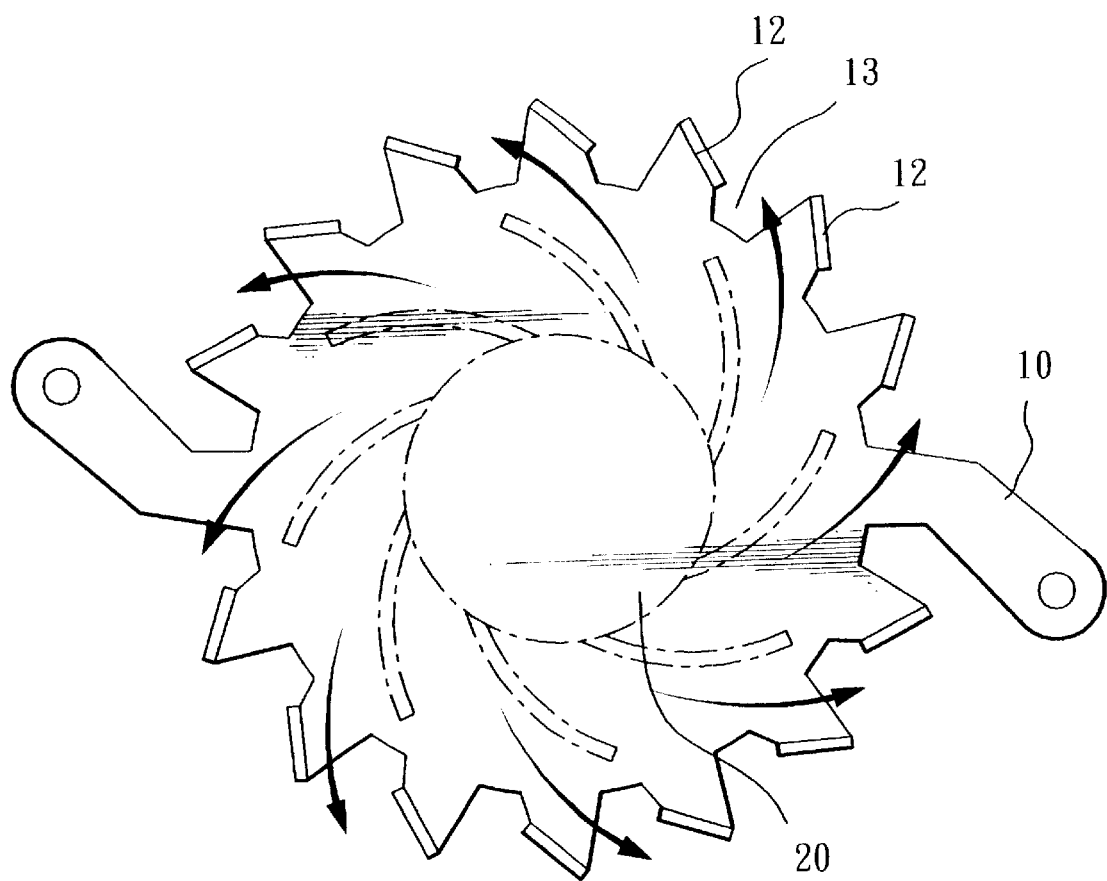
FIG. 4 is a schematic drawing of wind conduction of the present invention.

Referring to FIGS. 3 and 4, the schematic drawings of the assembled present invention and the wind conduction, as the fan (20) starts to run and transmit the blowing air current towards the lateral plate (12), through the conduct current wind channel formed between the lateral plate (12) and the cut plane, the air current is conducted accordingly toward the air outlet (13). Since the included angles formed by the lateral plates (12) are disposed according to the directions of the whirling wind channels of the fan (20), the reverse current phenomenon caused by the reflection and collision of the air current is eliminated. Therefore, the lateral plate (12) interferences cause the air current to flow in reverse direction. Furthermore, the included angles formed thereby reduce the area of flowing field, increase the wind pressure flowing toward the air outlet (13) and relatively increase the flowing speed of the air current to make the air current circulation smoother so as to continuously and rapidly dissipate the heat toward the air outlet (13) without causing the situation of standstill. At the same time, the heat absorbed by the bottom plate (11) is also rapidly dissipated toward the air outlet (13) through the wind channel to fully achieve the efficiency of heat dissipation.

Once special feature worthy of mention is that the heat sink base can be molded by punch press, which not only increases the speed of production, but also utilizes the spatial area to minimize the materials wasted and tremendously reducing the costs of production.

However, the terminology utilized for the drawings and element have been selected to facilitate the description of the present invention and shall not be construed as a limitation on the patented scope and claims of the present invention. Furthermore, all substitutions of equivalent element by persons skilled in the relevant technology based on the spirit of the present invention shall still be regarded as within the protected scope and claims of the new patent rights granted the present invention.

In summation, the improved heat dissipater structure is an invention of reasonable perfection that not only possesses outstanding practicality, but has an unprecedented structural spatial design that is original and innovative. Further, the present invention manifestly accelerates the speed of heat dissipation and specifically enhances the heat dissipation efficiency, is a solution to the issues of the conventional technology and is progressive and not a conception based merely on familiarity of utilization.

What is claimed is:

1. An improved heat dissipater structure comprising:
   a heat sink base comprising a flat base plate;
   a periphery of the base plate forming a plurality of fins extending upward, each fin is a flat vertical plate angled corresponding to a rotational direction of a fan as to provide airflow channels with adjacent fins;
   the flat base plate and the fins define a receiving cavity, the fan is disposed inside of the receiving cavity; a pair of hook-like blocks extending upward on opposite sides of the periphery of the flat base plate;
   a cover body having a central opening for air inlet, the cover body disposed on top of the base plate and the fan; a pair of upper retaining hooks extending downward in correspondence with the pair of the hook-like blocks and engaging with the hook-like blocks to retain the base plate, the fan and the cover body together; and a pair of stop blocks located on opposite sides of the cover body, extending downward from the cover body and pressed against the base plate.

* * * * *